(12) United States Patent
Hein et al.

(10) Patent No.: US 6,366,527 B2
(45) Date of Patent: Apr. 2, 2002

(54) CIRCUIT CONFIGURATION FOR GENERATING AN OUTPUT CLOCK SIGNAL WITH OPTIMIZED SIGNAL GENERATION TIME

(75) Inventors: Thomas Hein; Thilo Marx; Patrick Heyne, all of München (DE); Torsten Partsch, Research Triangle Park, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/773,220

(22) Filed: Jan. 31, 2001

(30) Foreign Application Priority Data

Jan. 31, 2000 (DE) .......................................... 100 04 108

(51) Int. Cl.[7] ................................................ G11C 8/00
(52) U.S. Cl. ................... 365/233; 365/230.02; 365/194
(58) Field of Search ........................... 365/233, 230.02, 365/194, 198, 190

(56) References Cited

U.S. PATENT DOCUMENTS

| | | | |
|---|---|---|---|
| 5,440,515 A | * 8/1995 | Chang et al. | ................ 365/194 |
| 5,771,201 A | 6/1998 | Cho | |
| 5,923,613 A | 7/1999 | Tien et al. | |
| 6,215,722 B1 | * 4/2001 | Park | ........................ 365/233 X |

FOREIGN PATENT DOCUMENTS

| | | | |
|---|---|---|---|
| WO | WO 98/23545 | 6/1998 | |

* cited by examiner

*Primary Examiner*—Huan Hoang
(74) *Attorney, Agent, or Firm*—Herbert L. Lerner; Laurence A. Greenberg; Werner H. Stemer

(57) ABSTRACT

DDR SDRAM memory chips require a highly precise output clock signal in order to pass the stored data onto a data highway at the correct instant. This signal is generated by a symmetrical circuit configuration that, by virtue of the integration of a multiplexer in a clock ratio compensator, additionally generates the output clock signal in a minimal time.

8 Claims, 3 Drawing Sheets

CIRCUIT CONFIGURATION FOR GENERATING AN OUTPUT CLOCK SIGNAL WITH OPTIMIZED SIGNAL GENERATION TIME

BACKGROUND OF THE INVENTION

Field of the Invention

The invention relates to a circuit configuration for generating a local output clock signal for controlling an instant at which data are output from an output delay device at an output of a cell array of a memory onto a data highway. The local output clock signal can be generated using a clock ratio compensator and a multiplexer in a manner dependent on a differential input clock signal and a programmable switch-over signal, in such a way that the outputting of the data onto the data highway is synchronized with either whole clock cycles of the data highway or else integer fractions thereof.

Memory chips generally contain a plurality of cell arrays or cell array strips in which the data are stored, the cell arrays are connected to inputs/outputs of the memory chip by a plurality of control devices and data highways.

In order to coordinate the data stream produced during data accesses to the cell arrays, a clock signal is used. This signal, once it has been passed to a signal input of a cell array, drives across the entire cell array and ensures that the data situated in the activated memory cells are read and brought to the output of the cell array, from where they pass onto the data highway.

In double data rate synchronous dynamic random access memory chips (double data rate memory chips with synchronous access), DDR SDRAMs for short, a differential input clock signal is used as the clock signal. It contains two clock pulses of the same frequency which are shifted by half a clock cycle relative to one another.

In order to avoid data collisions, the data which have been brought to the output of the cell array must be output onto the data highway at a precisely defined output instant, which must be synchronized with the clock of the data highway. In this case, the outputting of the data onto the data highway may be synchronized with either whole clock cycles of the data highway or else integer fractions thereof. Since the individual data that are intended to be accessed are stored at different locations within the cell array, it is possible for the individual data to arrive in the "wrong" order, too early or too late at the output of the cell array. Therefore, particularly in the case of DDR SDRAMs, it is customary to provide at the output of a cell array an output delay device which ensures that the arriving data are sorted correctly and output onto the data highway at a precisely defined instant. By way of example, the output delay device is realized by a shift register, known per se.

In order to control the data output by the output delay device, a highly precise output clock signal, inter alia, is required, which is newly generated by the two clock pulses of the differential input clock signal locally in the output delay device. This output clock signal must have a clock ratio of almost 50%. The differential input clock signal itself is unsuitable for this task since the falling edges of the differential clock pulse, as a result of being driven across the cell array, "smear", that is to say lose definition and thus timing force.

The generation of the output clock signal is normally achieved by only one type of edges of the differential input clock signal, for example the rising edges, which are not subject to the problem of "smearing" and thus yield a usable measure of both whole and, for example, half clock cycles, being applied to a clock ratio compensator. The latter generates, from the two rising edges of the two clock signals of the differential input clock signal, an output clock signal which contains two clock signals and, on account of sharp rising edges and of sharp falling edges, has a "maximum" clock ratio, i.e. the pulses of the two clock signals are maximally wide but do not overlap one another.

In order that the above-described output delay device can be used as flexibly as possible, the output clock signal which controls the output delay device and is generated by the clock ratio compensator can additionally be altered by a programmable switch-over signal over the period of any desired clock cycles. The switch-over signal thus influences the clock rate of the output clock signal and, moreover, determines at which of the possible output instants the corresponding data (bits) are output. The possible output instants themselves are determined, as described above, by the differential input clock signal.

The output clock signal "cleaned up" by the clock ratio compensator is altered for example by a multiplexer which is connected downstream and arbitrarily interchanges the signal levels of the two clock signals of the output clock signal in a manner dependent on the programmable switch-over signal.

What is disadvantageous about the prior art described above is that despite clock ratio compensators, on account of signal propagation time differences within the clock ratio compensation, the two "cleaned up" clock signals at the output of the clock ratio compensator are not absolutely exactly inverted with respect to one another but rather are additionally shifted by a small amount relative to one another, which produces a signal overlap and can thus lead to problems during the data output. Furthermore, the series connection of the clock ratio compensator and the multiplexer has the effect that a relatively long time passes before the "completion" of the output clock signal, which can lead to synchronization problems with the clock of the data highway and thus limits the maximum clock frequency of the memory.

SUMMARY OF THE INVENTION

It is accordingly an object of the invention to provide a circuit configuration for generating an output clock signal with optimized signal generation time which overcomes the above-mentioned disadvantages of the prior art devices of this general type, which eliminates the disadvantages dictated by propagation time.

With the foregoing and other objects in view there is provided, in accordance with the invention, a combination of a memory chip with a circuit configuration for generating a local output clock signal for controlling an instant at which data are output from an output delay device at an output of a cell array of the memory chip onto a data highway. The circuit configuration contains outputs and a clock ratio compensator formed of two coupled, mutually symmetrical paths for generating the local output clock signal and receiving a differential input clock signal. Each of the two coupled, mutually symmetrical paths have switches connected to one of the outputs, and a multiplexer formed of at least two programmable signal feed-in points connected to the switches. The multiplexer provides the local output clock signal in a manner dependent on a switch-over signal and is connected through the switches to one of the outputs. The switches are opened and closed in a manner dependent on the differential input clock signal, and an outputting of the data onto the data highway is synchronized with whole clock cycles of the data highway or integer fractions of the whole clock cycles.

The object is achieved according to the invention by virtue of the fact that the clock ratio compensator is constructed from two coupled, mutually symmetrical paths in which the multiplexer is integrated and has in each case at least two programmable signal feed-in points, which generate the output clock signal in a manner dependent on the switch-over signal and are connected via switches to the outputs of the circuit configuration. The switches being opened or closed in a manner dependent on the differential input clock signal.

The clock ratio compensator is constructed from the two mutually symmetrical paths. Each of the two inputs of the circuit configuration is connected to one of the two paths.

Each of the paths has an operating cycle that is repeated periodically and can be divided into two phases: an output clock signal preparation phase and an output clock signal output phase. The operating phases of the two paths are complementary to one another, i.e. while one path is in the output clock signal preparation phase, the other path of the circuit configuration is in the output clock signal output phase.

Each of the paths has at least two signal feed-in points that are connected to one of the outputs of the circuit configuration through a respective switch, for example realized by transfer elements. In the output clock signal preparation phase, a next output clock signal to be output is prepared at the two signal feed-in points in a manner dependent on the switch-over signal of the respective path, the switches being open. In other words the output clock signal is not able to pass to the outputs of the circuit configuration. In the output clock signal output phase, which is initiated by a rising edge of the differential input clock signal at the input of the respective path, the switch is closed and the output clock signal prepared in the preceding output clock signal preparation phase is thus applied to the two outputs. The two switches are then closed again.

The two paths are in this case coupled in such a way that the outputting of the output signal by one path effects the starting of the signal preparation phase of the other path, and vice versa.

An essential feature of the present invention, then, is that the function of the multiplexer is undertaken by the clock ratio compensator itself, by being provided with signal feed-in points. Thus, unlike what has happened hitherto in the prior art, a signal generated by the clock ratio compensator does not have to be manipulated a further time by a multiplexer in order to obtain the desired output clock signal, rather the desired output clock signal is generated in a single process. This has the advantage that the multiplexer connected downstream of the clock ratio compensator is omitted, whereby the processing time of the multiplexer which is required in the prior art is omitted. This time saving results, in turn, that higher clock rates of the memory chip can be realized.

The output clock signal which can be generated by the signal feed-in points and can be programmed in a manner dependent on a switch-over signal is thus prepared in the period of time before the rising edge of the differential input clock signal is applied to the corresponding input of the path of the circuit configuration so that it is then applied to the outputs immediately, that is to say without delay, when the rising edge arrives.

It is a further advantage of the invention that, as a result of the symmetrical structure, no propagation time difference between the two output clock pulses of which the output clock signal is composed occurs at the two outputs of the circuit configuration. Consequently, it is possible to obtain two signals which are exactly complementary, i.e. inverted, with respect to one another.

In accordance with an added feature of the invention, each of the two coupled, mutually symmetrical paths of the clock ratio compensator contains at least one input, the at least two programmable signal feed-in points, at least two of the switches coupled to the at least two programmable signal feed-in points, at least two holding elements connected to the switches, and at least one of the outputs.

In accordance with an additional feature of the invention, each of the switches has four terminals. A first of the terminals is connected to one of the outputs, a second of the terminals is connected to one of the programmable signal feed-in points, and a third and a fourth of the terminals are connected to a respective node controlling a corresponding one of the switches.

In accordance with another feature of the invention, the switches each contain a p-channel field-effect transistor and an n-channel field-effect transistor.

In accordance with a further feature of the invention, each of the two coupled, mutually symmetrical paths has two of the switches and the two switches in each case are connected to a same one of the outputs.

In accordance with another added feature of the invention, the memory chip is a random access memory chip with synchronous access (SDRAM). More specifically, the SDRAM chip is a double data rate random access memory chip with synchronous access.

In accordance with a concomitant feature of the invention, the local output clock signal can be generated in such a way that the outputting of the data onto the data highway is synchronized with whole or half clock cycles of the data highway.

Other features which are considered as characteristic for the invention are set forth in the appended claims.

Although the invention is illustrated and described herein as embodied in a circuit configuration for generating an output clock signal with optimized signal generation time, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
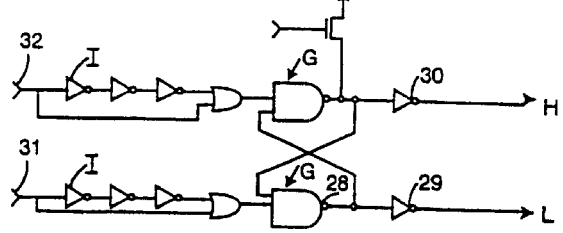
FIG. 4 is a circuit diagram of a clock ratio compensator according to the prior art.

In all the figures of the drawing, sub-features and integral parts that correspond to one another bear the same reference symbol in each case. Referring now to the figures of the drawing in detail and first, particularly, to FIG. 4 thereof, there is shown a clock ratio compensator according to the prior art. If a rising edge appears at, for example, an input 31 of a circuit formed of inverters I and gates G, then the resulting pulse sets both a node 29 and a node 30 either to a high ("H") or a low ("L") voltage. However, the signal requires more propagation time from an output 28 of an AND gate in regards to the node 30 than from the output 28 in regards to the node 29. The nodes 29 and 30 are thus set at different instants, i.e. a signal overlap is produced.

Figure 5:
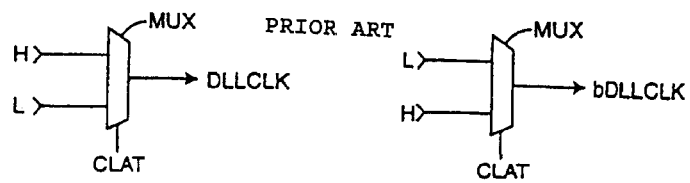
FIG. 5 is a circuit diagram of a multiplexer according to the prior art.

The nodes 29, 30 are connected in a customary manner to a multiplex MUX (see FIG. 5), which yields an output clock signal DLLCLK or bDLLCLK in a manner dependent on a switch-over signal CLAT and the respective state of the nodes 29, 30 ("H" or "L").

Figure 1:
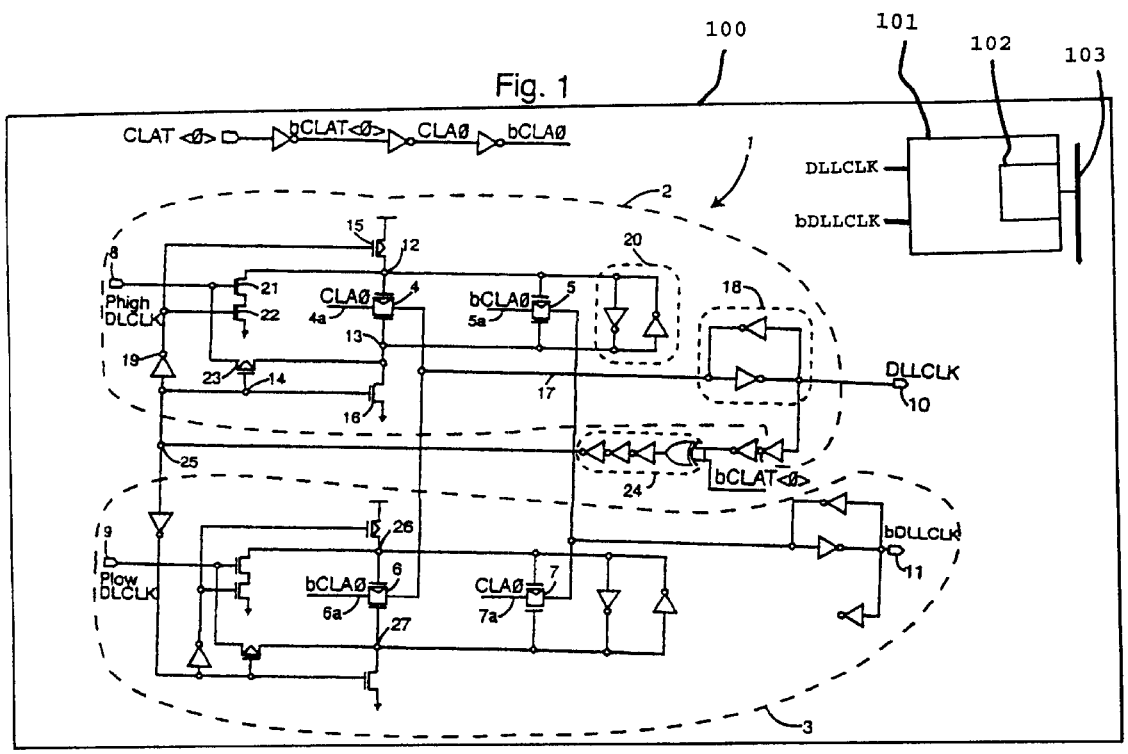
FIG. 1 is a circuit diagram of an embodiment of a circuit configuration according to the invention.

In contrast, FIG. 1 shows a memory chip 100 having memory cell arrays 101 (only one of the memory array cells being shown). The memory chip 100 is shown with a particularly preferred embodiment of a circuit configuration 1 according to the invention for coordinating an outputting of data from an output delay device 102 of the individual memory cell arrays 101 onto a data highway or bus 103.

The circuit configuration 1 contains two mutually symmetrical paths 2 and 3, of which each (the reference symbols are specified here by way of example for only path 2) has one input 8, five transistors 15, 16, 21, 22 and 23, two signal feed-in points 4a and 5a, two switches 4 and 5 each containing a transfer element, two holding elements 18 and 20 each formed of two inverters, and one output 10. The component parts are connected to one another in the manner shown in FIG. 1.

The method of operation of the circuit configuration 1 will be described in more detail below. To that end, one complete clock cycle of the path 2 with an overlapping, differential input clock signal will be described, the clock cycle being characterized by four instants t1 to t4 (see FIG. 3). The same considerations also apply to a non-overlapping, differential input clock signal (see FIG. 2).

At an instant t1, a node 19 is discharged. Therefore, the transistor 15 driven by the node 19 turns on. This in turn results in a node 12 being charged. At the instant t1, a node 14 is likewise charged. This causes the transistor 16 to be in the on state, which in turn results in a node 13 being discharged to ground.

The combination of the charged node 12 and the discharged node 13 causes the switches 4 and 5 to turn off (non-conducting). The switches 4, 5 are preferably realized by transfer elements, each containing a p-channel field-effect transistor and an n-channel field-effect transistor. The turned-off switches 4, 5 have the effect that signals CLA0 (see FIGS. 2 and 3, line 1 in each case) and bCLA0, which are made available by the feed-in points 4a and 5a, respectively, are generated by a programmable switch-over signal CLAT and are present at the switches 4, 5, cannot pass to the outputs 10 and 11 of the circuit configuration. The signal bCLA0 is the inverse of the signal CLA0. Accordingly, the signal at a node 17 is held exclusively by the holding element 18.

At an instant t2, the node 19 is charged, which results in the transistor 15 turning off (non-conducting). Furthermore, at the instant t2, the node 14 is discharged, which results in the transistor 16 likewise turning off. Therefore, the two nodes 12 and 13 are "decoupled" from the power supply via the transistor 15 and the transistor 23, respectively. The voltage values prevailing at the nodes 12 and 13 are held exclusively by the holding element 20 after the decoupling instant.

At an instant t3, a rising edge then arrives at the input 8. The differential input clock signal PhighDLCLK (see FIGS. 2 and 3, line 2 in each case) thus changes its value from low voltage to high voltage. This causes the transistor 21 to be turned on. Since the transistor 22 is likewise in the on state on account of the charged node 19, the node 12 is discharged to ground. Since the node 14 is discharged, the transistor 23 is likewise in the on state (conducting) and, via the input 8, effects charging of the node 13. The combination of discharged node 12 and charged node 13 causes the two switches 4 and 5, respectively, to be turned on and the prepared signals CLA0 and bCLA0, to be applied to the outputs 10 and 11, where they can be picked off as output clock signals DLLCLK and bDLLCLK, respectively (see FIGS. 2 and 3, last line in each case. The signal profiles at the nodes 19, 14, 13 and 12 are shown in each case in lines 3 to 6 in FIGS. 2 and 3).

At an instant t4, the signal CLA0 passed to the output 10 by the switch 4 and passes through a delay chain 24 to a node 25. The latter is thereby charged, which results in the transistor 23 turning off and the transistor 16 turning on. This causes the node 13 to be discharged via ground. On the other hand, the charging of the node 25 causes the node 19 to be discharged. It follows from this, in turn, that the transistor 22 turns off and the transistor 15 turns on. This in turn causes the node 12 to be charged. The combination of charged node 12 and discharged node 13 causes the two switches 4 and 5 to turn off (non-conducting).

Thus, a full clock cycle has been traversed and the state as defined by the instant t1 has been reached again.

The coupling of the path 2 through the node 25 to the path 3 has the effect that when the node 25 is charged, the two nodes 26 and 27, respectively, are decoupled from the power supply. As a result, precisely at the instant when the switches 4 and 5 of the path 2 turn off again, the lower path 3 in FIG. 1 is ready, when a rising edge arrives at an input 9, to turn the two switches 6 and 7 on and thus to apply the signal bCLA0 and CLA0, respectively, to the two outputs 10 and 11. Consequently, in the preparation phase of the path 2, the outputting of the desired output clock signal can be undertaken by the path 3. This produces the desired output clock signal DLLCLK and bDLLCLK optimized with regard to the signal propagation time and signal generation time.

Figure 2:
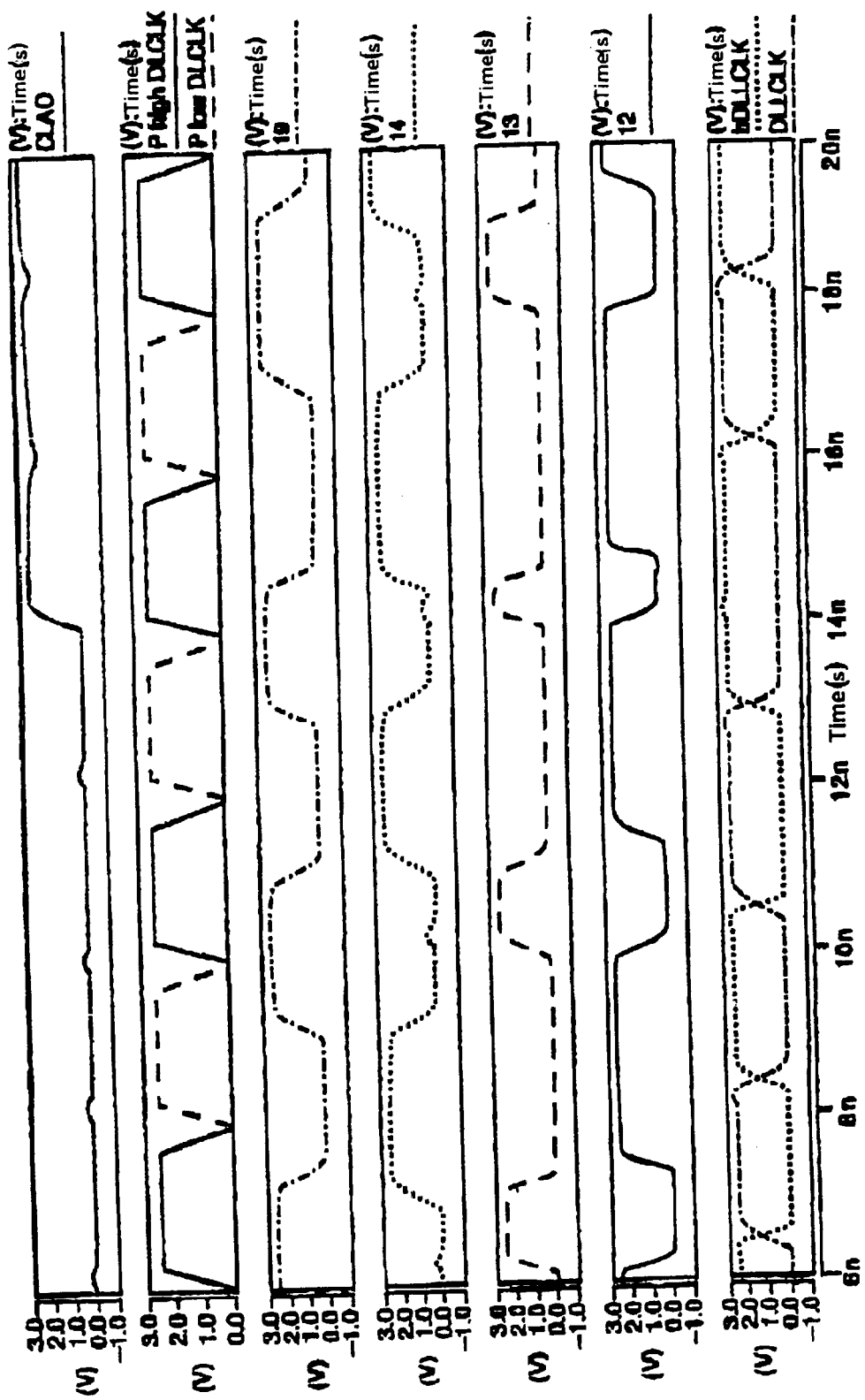
FIG. 2 is a graph showing voltage values at various points of the circuit configuration with a non-overlapping differential input clock signal.
Figure 3:
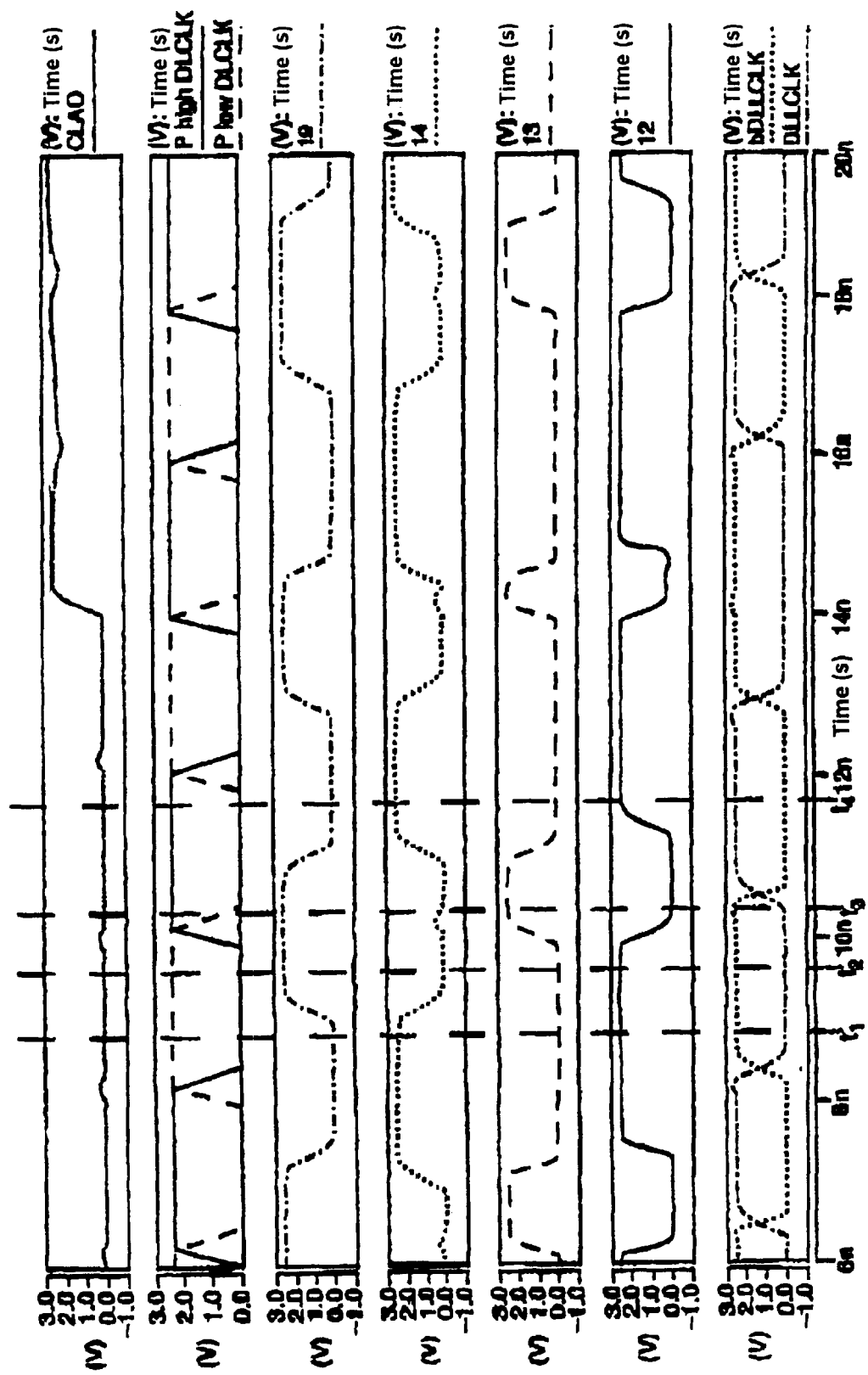
FIG. 3 is a graph showing the voltage values at various points of the circuit configuration with an overlapping differential input clock signal.

As evident from FIGS. 2 and 3, the above-described generation of the output clock signal DLLCLK and bDLLCLK is possible both with an overlapping and with a non-overlapping differential input clock signal. This results from the fact that only the rising edges of the differential input clock signal PhighDLCLK and PlowDLCLK are used for generating the output clock signal.

We claim:

1. In combination with a memory chip, a circuit configuration for generating a local output clock signal for controlling an instant at which data are output from an output delay device at an output of a cell array of the memory chip onto a data highway, the circuit configuration comprising:

outputs; and a clock ratio compensator formed of two coupled, mutually symmetrical paths for generating the local output clock signal and receiving a differential input clock signal, each of said two coupled, mutually symmetrical paths has switches connected to one of said outputs and a multiplexer formed of at least two programmable signal feed-in points connected to said switches, said multiplexer providing the local output clock signal in a manner dependent on a switch-over signal and is connected through said switches to one of said outputs, said switches being opened and closed in a manner dependent on the differential input clock signal, and an outputting of the data onto the data highway is synchronized with one of whole clock cycles of the data highway and integer fractions of the whole clock cycles.

2. The circuit configuration according to claim 1, wherein each of said two coupled, mutually symmetrical paths of said clock ratio compensator contain at least one input, said at least two programmable signal feed-in points, at least two of said switches coupled to said at least two programmable signal feed-in points, at least two holding elements connected to said switches, and at least one of said outputs.

3. The circuit configuration according to claim 1, wherein said switches each contain a p-channel field-effect transistor and an n-channel field-effect transistor.

4. The circuit configuration according to claim 1, wherein the local output clock signal can be generated in such a way that the outputting of the data onto the data highway is synchronized with one of whole and half clock cycles of the data highway.

5. The circuit configuration according to claim 1, wherein each of said switches have four terminals, a first of said terminals is connected to one of said outputs, a second of said terminals is connected to one of said programmable signal feed-in points and a third and a fourth of said terminals are connected to a respective node controlling a corresponding one of said switches.

6. The circuit configuration according to claim 5, wherein each of said two coupled, mutually symmetrical paths has two of said switches and said two switches in each case are connected to a same one of said outputs.

7. The circuit configuration according to claim 1, wherein the memory chip is a random access memory chip with synchronous access (SDRAM).

8. The circuit configuration according to claim 7, wherein said SDRAM chip is a double data rate random access memory chip with synchronous access.

* * * * *